United States Patent [19]

Chen et al.

[11] Patent Number: 5,128,008

[45] Date of Patent: Jul. 7, 1992

[54] METHOD OF FORMING A MICROELECTRONIC PACKAGE HAVING A COPPER SUBSTRATE

[75] Inventors: Pei C. Chen, Endicott; Richard D. Weale, Owego, both of N.Y.

[73] Assignee: International Business Machines Corporation, Armonk, N.Y.

[21] Appl. No.: 682,994

[22] Filed: Apr. 10, 1991

[51] Int. Cl.⁵ .............................................. C23C 14/34
[52] U.S. Cl. .................................................. 204/192.15
[58] Field of Search ........................ 204/192.14, 192.15; 427/99, 124, 309, 318, 319, 405, 409; 428/626

[56] References Cited

U.S. PATENT DOCUMENTS

| | | | |
|---|---|---|---|
| 3,781,596 | 12/1973 | Galli et al. | 357/71 X |
| 3,853,961 | 12/1974 | Birkenstock et al. | 560/202 |
| 3,958,317 | 5/1976 | Peart et al. | 428/601 |
| 4,416,725 | 11/1983 | Cuomo et al. | 156/635 |
| 4,524,089 | 6/1985 | Haque et al. | 427/38 |
| 4,588,641 | 5/1986 | Haque et al. | 428/413 |
| 4,863,808 | 9/1989 | Sallo | 428/601 |
| 4,902,551 | 2/1990 | Nakaso et al. | 428/137 |
| 4,917,963 | 4/1990 | Kittler | 428/610 |

Primary Examiner—Aaron Weisstuch
Attorney, Agent, or Firm—Richard M. Goldman

[57] ABSTRACT

Disclosed is a method of fabricating a microelectronic package having least one layer formed of a copper surface core, e.g., a copper-Invar-copper core, with a polymeric dielectric film. The method includes removing copper oxide from the copper surface of the metallic core or layer. After this step an adhesion layer, such as a chromium layer, a nickel layer, or chromium and nickel or chromium and copper bilayers, is sputter deposited onto the copper surface of metallic core or layer. A polymeric dielectric film is then applied atop the metallic adhesion layer.

16 Claims, 2 Drawing Sheets

METHOD OF FORMING A MICROELECTRONIC PACKAGE HAVING A COPPER SUBSTRATE

FIELD OF THE INVENTION

The invention relates to the fabrication of metal core microelectronic circuit packages. More particularly the invention relates to microelectronic circuit packages having polymer encapsulated copper cores, for example, polyimide encapsulated Copper-Invar-Copper (CIC) cores. According to the method of the invention, increased adhesion is obtained between the metal and polymer by proper pre-treatment of the metal prior to application of the polymer. This pre-treatment includes removing copper oxide from the copper surface of the metal core or layer, and thermally decomposing the remaining copper oxide. After these oxide removal steps an adhesion layer, such as a chromium layer, may be sputter deposited onto the copper surface of the core or layer. The polymeric dielectric film is then applied atop the metallic adhesion layer.

"Invar" is a registered trademark of Imphy S.A. 168 Rue De Rivoli, Paris, France for an "alloy which is substantially inexpansible," Registration No. 0063970. Invar is an iron-nickel alloy containing approximately sixty four weight percent iron and thirty six weight percent nickel.

BACKGROUND OF THE INVENTION

The general structures and manufacturing processes for electronic packages are described in, for example, Donald P. Seraphim, Ronald Lasky, and Che-Yo Li, *Principles of Electronic Packaging*, McGraw-Hill Book Company, New York, N.Y., (1988), and Rao R. Tummala and Eugene J. Rymaszewski, *Microelectronic Packaging Handbook*, Van Nostrand Reinhold, New York, N.Y. (1988), both of which are hereby incorporated herein by reference.

As described by Seraphim et al., and Tummala et al., an electronic circuit contains many individual electronic circuit components, e.g., thousands or even millions of individual resistors, capacitors, inductors, diodes, and transistors. These individual circuit components are interconnected to form the circuits, and the individual circuits are further interconnected to form functional units. Power and signal distribution are done through these interconnections. The individual functional units require mechanical support and structural protection. The electrical circuits require electrical energy to function, and the removal of thermal energy to remain functional. Microelectronic packages, such as, chips, modules, circuit cards, circuit boards, and combinations thereof, are used to protect, house, cool, and interconnect circuit components and circuits.

Within a single integrated circuit, circuit component to circuit component and circuit to circuit interconnection, heat dissipation, and mechanical protection are provided by an integrated circuit chip. This chip is referred to as the "zeroth" level of packaging, while the chip enclosed within its module is referred to as the first level of packaging.

There is at least one further level of packaging. The second level of packaging is the circuit card. A circuit card performs at least four functions. First, the circuit card is employed because the total required circuit or bit count to perform a desired function exceeds the bit count of the first level package, i.e., the chip. Second, the circuit card provides for signal interconnection with other circuit elements. Third, the second level package, i.e., the circuit card, provides a site for components that are not readily integrated into the first level package, i.e., the chip or module. These components include, e.g., capacitors, precision resistors, inductors, electro-mechanical switches, optical couplers, and the like. Fourth, the second level package provides for thermal management, i.e., heat dissipation. One type of printed circuit board is a metal core printed circuit board.

Metal core printed circuit boards are described by Nandakumar G. Aakalu and Frank J. Bolda in "Coated-Metal Packaging", in Rao R. Tummala and Eugene J. Rymaszewski, *Microelectronic Packaging Handbook*, Van Nostrand Reinhold, New York, N.Y. (1988), at pages 923 to 953, specifically incorporated herein by reference.

As used herein, coated metal packages, also referred to as metal core packages, are polymer encapsulated conductive metal cores. Circuitization, that is, personalization, is carried out on the surface of the polymeric encapsulant, with vias and through holes passing through the polymeric encapsulant and the metal core.

The metal core may be a copper core, or a copper-Invar-copper core. Copper and copper-Invar-copper cores spread out the heat from the devices mounted on the card or board. The high thermal conductivity allows the devices, for example the memory devices or logic devices, to operate at lower temperatures. The metal core also provides high mechanical strength and rigidity to the package. The metal core allows the substrate to carry large and heavy components, and to function in environments where shock, vibration, heat, and survivability are a factor.

Copper-Invar-copper is a particularly desirable core material because of its thermal, electrical, and mechanical properties. Invar is an iron-nickel alloy containing approximately sixty four weight percent iron and thirty six weight percent nickel. While deviations from this composition are possible, the 64-36 alloy has the lowest coefficient of thermal expansion in the iron-nickel binary system, approximately $1.5 \times 10^{-7}$/degree Centigrade.

Lamination of the Invar between copper films of controlled thickness determines the properties of the copper-Invar-copper core. This is shown in Table 1, below, adapted from Nandakumar G. Aakalu and Frank J. Bolda in "Coated-Metal Packaging", in Rao R. Tummala and Eugene J. Rymaszewski, *Microelectronic Packaging Handbook*, Van Nostrand Reinhold, New York, N.Y. (1988), Table 13-2, at page 932.

TABLE 1

| Property | Properties of Copper-Invar-Copper | |
|---|---|---|
| | Cu/In/Cu | Cu/In/Cu |
| %Cu/%Invar/%Cu | 12.5/75/12.5 | 20/60/20 |
| Coefficient of thermal expansion ($\times 10^{-7}$/deg C.) | 44 | 53 |
| Electrical Resistivity (micro-ohm-cm) | 7.0 | 4.3 |
| Young's Modulus ($10^5$ mPa) | 1.4 | 1.35 |
| Enlongation (%) | 2.0 | 2.5 |
| Tensile Strength (mPa) | 380–480 | 310–410 |
| Density (grams/cm$^3$) | 8.33 | 8.43 |
| Thermal Conductivity | | |
| x-y plane | 107 | 160 |
| z plane | 14 | 18 |
| Thermal Diffusivity | 0.249 | 0.432 |

TABLE 1-continued

| Property | Properties of Copper-Invar-Copper | |
|---|---|---|
| | Cu/In/Cu | Cu/In/Cu |
| (cm$^2$/second) | | |
| Specific Heat | 0.484 | 0.459 |
| (Watts/gm deg C.) | | |
| Yield Strength | 240-340 | 170-270 |

The polymer coating may be a perfluorocarbon, a phenolic, an epoxy, or a polyimide. For example, the coating may be a phenolic-fiber composite, exemplified by phenolic and paper. Alternatively, the coating may be an epoxy-fiber composite, illustrated by, for example, epoxy and glass fiber, and epoxy and polyperfluorocarbon fiber. According to a still further alternative, the coating may be a polyimide-fiber composite, such as polyimide and glass fiber, polytetrafluoroethylene and glass fiber, or polyimide and polyperfluorocarbon fiber.

Particularly critical is the adhesion of the polymer to the underlying metal. For example, the peel strength between pyromellitic dianhydride—oxydianiline (PMDA-ODA) and a chromium coated, 0.002 inch thick, Copper/Invar/Copper substrate is on the order of 1 to 2 grams per millimeter. The failure site is at the polyimide—chromium interface.

Various approaches have been used to improve the adhesion of polymers, as polyimides, to metals, as copper. For example, U.S. Pat. No. 4,902,551 to Yuko Kimura, Akishi Nakaso, Haruo Ogino, Toshiro Okamura, and Tomoko Watanabe (assignors to Hitachi Chemical Co., Ltd) recognizes the existence of a copper oxide layer on the copper, and first forms the copper oxide layer in a alkaline solution and thereafter electrolytically removes the copper oxide layer to enhance the adhesion of the polymer to the copper.

In U.S. Pat. No. 3,958,317 of Leland L. Peart and John S. Schiavo, assigned to Rockwell International, a copper chromium laminate is described, with an epoxy resin bonded thereto. In order to promote the adhesion of the epoxy resin, the chromium is partially etched. It is stated that the roughened, cracked chromium surface improved the adhesion of the epoxy thereto.

In U.S. Pat. No. 3,853,961 to E. Caule, assigned to Olin, plastic is laminated to copper to provide a tarnish free coating. The copper substrate is oxidized to form an oxide film, and then reacted with a phosphate to form a glassy, copper phosphate coating. The polymer is laminated to this coating. In U.S. Pat. Nos. 4,524,089 and 4,588,641 of R. Haque and E. F. Smith (assigned to Olin Corp.) there is described a method of coating a polymeric film onto a copper substrate. This is a multistep, multi-plasma process. As described in Haque et al., the substrate is exposed to an oxygen plasma, then to a hydrocarbon monomer gas plasma, and finally to another oxygen plasma.

In U.S. Pat. No. 4,416,725 to J. J. Cuomo, P. A. Leary, and D. S. Yee (assigned to International Business Machines Corp.) there is described a method of coating a copper surface by placing it in a chamber, charging the chamber with iodine vapor, and forming an iodine plasma to form a copper iodide film. The copper iodide film is then textured. This is reported to improve the adhesion of coatings, as polyimide, polyester, and polymethyl methacrylate, to the copper.

Other techniques to improve the adhesion of polyimide to copper, as the copper surface of a Cu/Invar/Cu body, include applying a thin film, metallic adhesion layer, as a thin film adhesion layer of chromium, to the copper. Still other techniques include treatment with oxygen containing or forming plasmas, stress relief, and chemical pre-treatments. Notwithstanding these expedients, metal-polyimide adhesion values of only 1-2 grams/millimeter were obtained.

OBJECTS OF THE INVENTION

It is one object of the invention to provide high density metal core cards and boards.

It is another object of the invention to provide high adhesion between the metal core and the polymeric encapsulant.

It is a further object of the invention to provide this adhesion in a process that introduces a minimum number of additional steps.

SUMMARY OF THE INVENTION

These and other objects are obtained by the microelectronic circuit package fabrication method of the invention. The fabrication method is useful for fabricating a metal core microelectronic package having at least one layer formed of copper, e.g., a Copper-Invar-Copper core, having a polymeric dielectric film on at least one surface thereof.

According to the method of the invention, a substrate is provided having a metallic layer or core. The layer or core may be a copper core, or a Copper-Invar-Copper laminate core or layer. The metallic core or layer has, on at least one side a copper surface, film, layer, or member and a polymeric dielectric film.

A metallic adhesion layer, a chromium layer, or a nickel-chromium or nickel-copper bilayer, is typically provided on the copper, between the copper and the polymeric dielectric. Thus, in the case of a package having a Copper-Invar-Copper core, a film or a metallic adhesion layer is provided between the Copper-Invar-Copper layer and the polymeric dielectric.

The method includes the steps of removing copper oxide from the copper surface of the core or layer, i.e., from the copper surface of the Copper-Invar-Copper core or layer. This copper oxide is a concomitant of the various fabrication steps and of the Copper-Invar-Copper lamination process.

The next step is sputter depositing the metallic adhesion layer onto the copper surface of the metallic core or layer, for example, the Copper-Invar-Copper core or layer. This metallic adhesion layer is typically a chromium layer, copper-chromium, or nickel-chromium bilayer. Typically the metallic adhesion layer is sputter deposited to a thickness of at least about 300 Angstroms of, for example, chromium onto the copper surface of the metallic core or layer.

The copper surface onto which the adhesion layer is sputtered may be the Copper of the Copper-Invar-Copper laminate, it may be the surface of a copper core or layer, or, according to a particularly preferred embodiment of the invention, the copper layer may be a layer that has been deposited, for example, sputter deposited atop the Copper-Invar-Copper laminate. According to this embodiment the copper is sputter deposited to a thickness of at least about 1000 Angstroms, and the chromium is sputter deposited atop the sputter deposited copper.

The next step is applying the polymeric dielectric film atop the metallic adhesion layer. The polymeric dielectric is typically a polyimide having suitable properties. One preferred class of polyimides is addition products, because of the absence of evolved water. A preferred class of addition polyimides is the bis-maleimide—methylene dianiline addition reaction products.

The invention provides high density metal core cards and boards. The cards and boards are characterized by high adhesion between the metal core and the polymeric encapsulant. Furthermore, the method of the invention introduces a minimum number of additional steps and contaminants.

THE FIGURES

The invention may be understood by reference to the Figures.

DETAILED DESCRIPTION OF THE INVENTION

Figure 1:
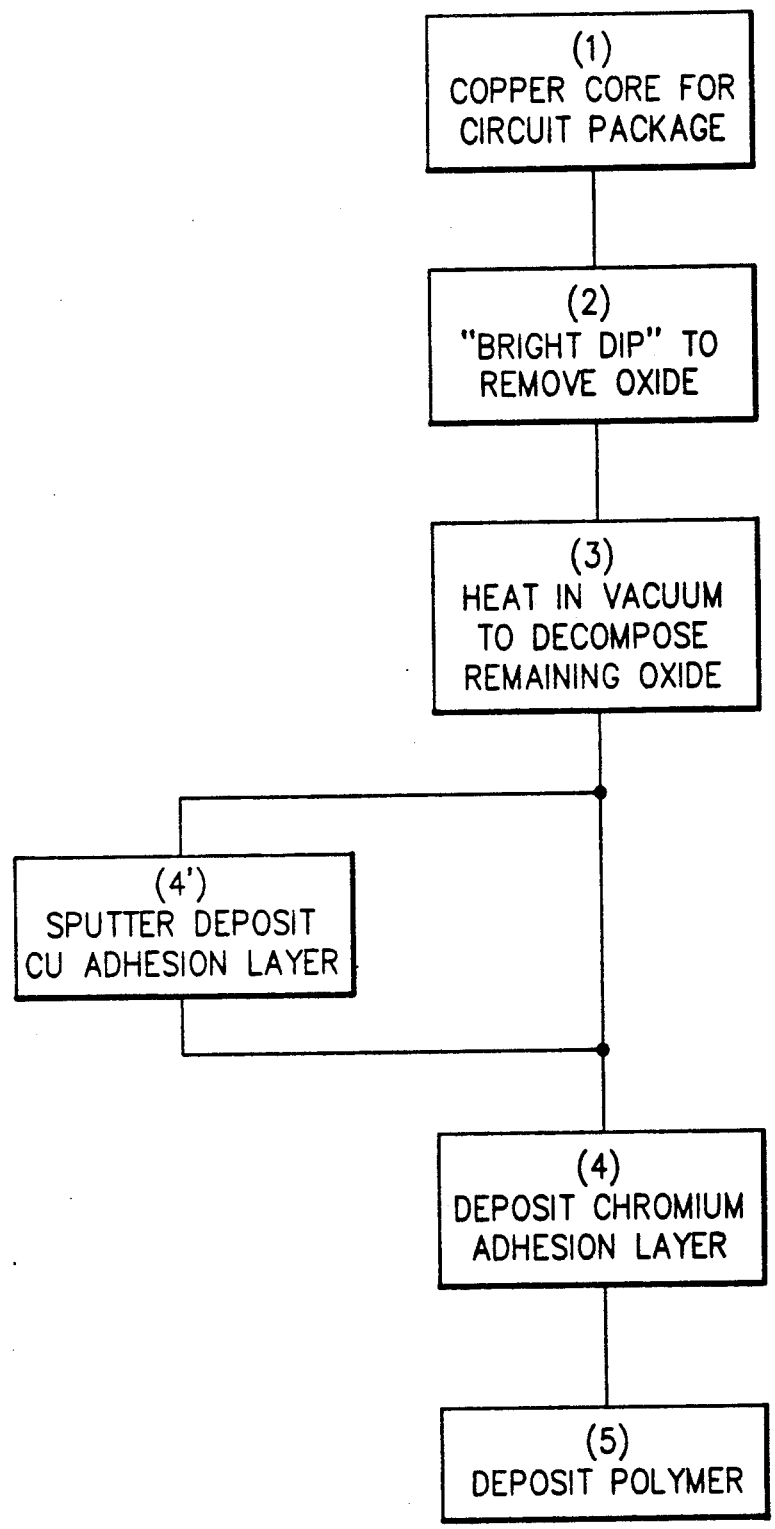
FIG. 1 is a flow chart of the method of the invention.
Figure 2:
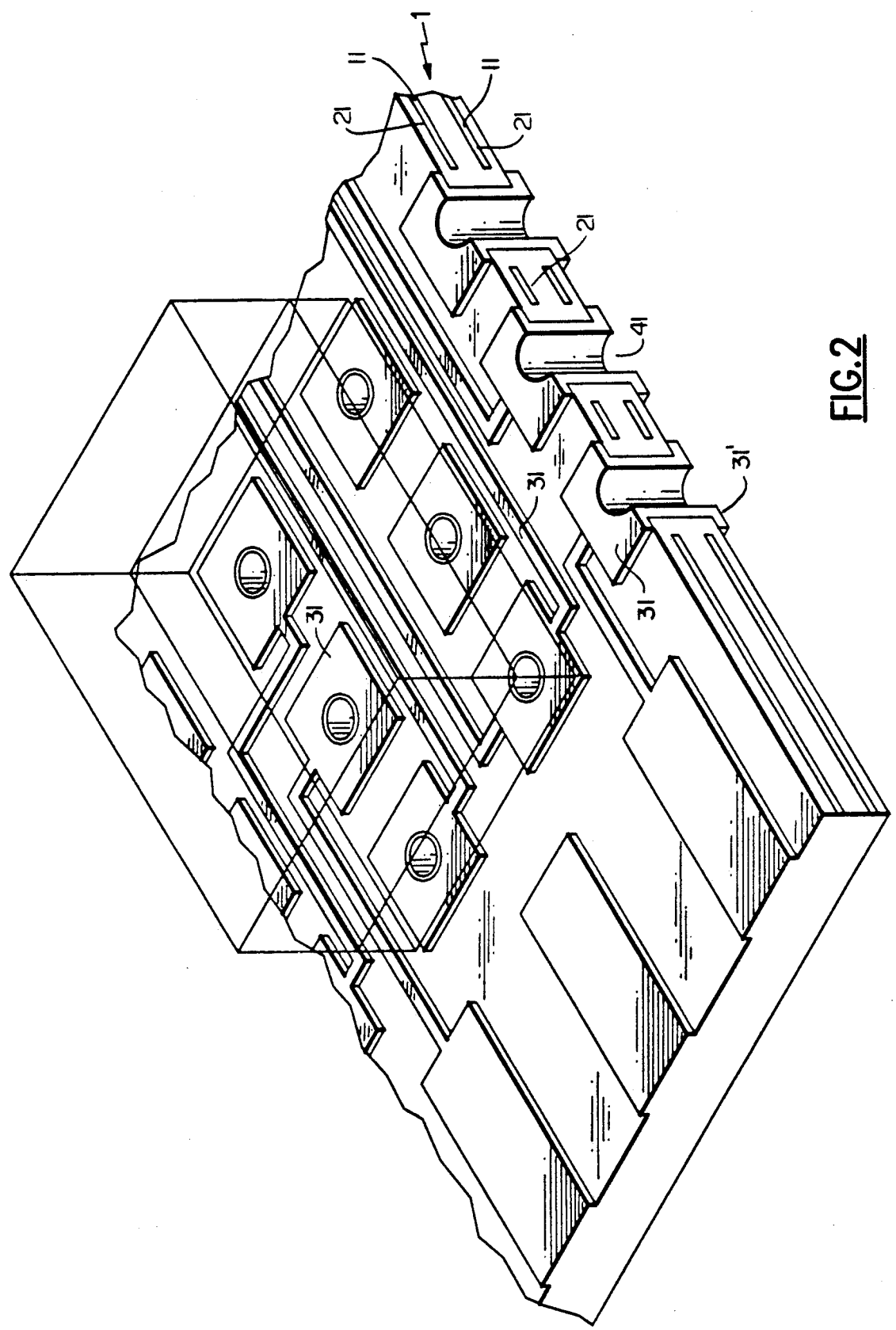
FIG. 2 is a perspective, partial cutaway view of a metal core package produced according to the method of the invention.

The method of the invention is illustrated in the flow chart of FIG. 1, and an electronic circuit package prepared thereby is shown in FIG. 2. FIG. 1 illustrates a microelectronic circuit package fabrication method useful for fabricating a metal core microelectronic package having at least one layer formed of a metal core encapsulated between a pair of polymeric dielectric films. The package so fabricated has a polymeric coating to metal peel strength above the 2 grams/millimeter of the prior art, e.g., 70 or 100 or more grams/millimeter.

The fabrication method of the invention is shown in the accompanying flow chart, FIG. 1. According to the method of the invention, a metal layer or core is provided. This is shown in block 1 of the flow chart. The layer or core may be a copper core, or a Copper-Invar-Copper laminate core or layer.

The method includes the step of removing copper oxide from the copper surface of the core or layer, i.e., from the copper surface of the Copper-Invar-Copper core or layer. This copper oxide is a concomitant of the various fabrication steps and of the Copper-Invar-Copper lamination process. The oxide removal is shown in blocks 2 and 3 of the flow chart. Block 2 illustrates the chemical removal of the oxide. This is referred to as a "bright dip" and includes a rinse in an oxidizing acid, for example 10 percent aqueous sulfuric acid, followed by two rinses in de-ionized water, two rinses in an organic solvent, such as isopropyl alcohol, and drying in heated nitrogen.

The second part of the oxide removal is shown in block 3 of the flow chart. This involves heating in a vacuum, e.g., heating at a pressure less than $10^{-7}$ to $10^{-6}$ torr. The temperature is generally at least about 400 degrees Centigrade, and preferably from about 380 degrees Centigrade to about 420 degrees Centigrade. The heating time is temperature dependent, and is generally at least about 1.5 hours at 400 degrees Centigrade.

The next step is sputter depositing the metallic adhesion layer onto the copper surface of the metallic core or layer, for example, the Copper-Invar-Copper core or layer. This step is shown as deposition of a Cr adhesion layer in block 4 of the flow chart, but the adhesion layer may alternatively be nickel-chromium, copper-chromium, or copper (outward from the substrate) as shown in block 4' of the flow chart. The metallic adhesion layer is typically a chromium layer. Typically the metallic adhesion layer is sputter deposited by a thickness of at least about 300 Angstroms of chromium onto the copper surface of the metallic core or layer.

The copper surface onto which the adhesion layer is sputtered may be the copper of the Copper-Invar-Copper laminate, it may be the surface of a copper core or layer, or, according to a particularly preferred embodiment of the invention, the copper layer may be a layer that has been deposited, for example, sputter deposited atop the Copper-Invar-Copper laminate or the copper core. According to this embodiment, incorporating the step shown in block 4' of the flow chart, the copper is sputter deposited to a thickness of at least about 1000 Angstroms, and the chromium or other adhesion layer material is sputter deposited atop the sputter deposited copper.

The next step is applying the polymeric dielectric film atop the metallic adhesion layer. This step is shown in block 5 of the flow chart. The polymeric dielectric is typically a polyimide. One preferred class of polyimides are addition products, because of the absence of evolved water. A preferred class of addition polyimides are the bis-maleimide—methylene dianiline addition reaction products.

A high density metal core package prepared by a method of the invention is shown in FIG. 2. The metal core circuit package 1 has a metal core 11 encapsulated by a pair of polymeric layers 21. The polymeric layers carry surface circuitization 31 including through holes 41. The through holes are characterized by dielectric coverage that allows high surface circuitization densities, i.e., ten or more vias and/or through holes per square centimeter, plated through hole diameters and via diameters of less than 0.8 millimeters, and especially plated through hole diameters and via diameters and capable of accommodating high wiring density surface circuitization, e.g. corresponding to surface circuitization line widths of 0.25 millimeters and less, with concomitant surface circuitization density.

To be noted is that the metal core package 1 shown in the figure is a two sided metal core circuit package having plated through holes connecting the surface circuitization, 31, 31', on both sides of the package, 1, without shorting the metal core, 11.

The invention provides high density metal core cards and boards. The cards and boards are characterized by high adhesion between the metal core and the polymeric encapsulant. Furthermore, the method of the invention introduces a minimum number of additional steps and contaminants.

The invention may be understood by reference to the following examples.

EXAMPLES

A series of tests were conducted to compare the results of an oxide reducing pre-treatment of a Copper-Invar-Copper film on the adhesion of a polymeric coating thereto. In each test a 2 mil thick Copper-Invar-Copper foil was dipped in a 10 percent aqueous solution of sulfuric acid at room temperature, rinsed twice with room temperature de-ionized water, and rinsed twice with room temperature isopropyl alcohol.

The Copper-Invar-Copper foils were then heated in a $10^{-7}$ to $10^{-6}$ torr vacuum at 400 degrees Centigrade for 1 hours and 30 minutes. Metallic coatings were then sputtered onto the Copper-Invar-Copper foils as follows:

1. 1000 Angstroms of Cu (samples 1 and 2);

2. 300 Angstroms of Cr (samples 1, 2, and 3); and
3. 200 Angstroms of Cu (sample 1).

A bis-maleimide—methylene dianiline addition reaction product polyimide was applied to the Copper-Invar-Copper foils atop the metal adhesion layers.

The laminates were then tested for peel strength in an Instron tester. The following results were obtained:

TABLE

| Sample | Example I | | |
|---|---|---|---|
| | 1 | 2 | 3 |
| Cu adhesion layer | X | X | no |
| Cr adhesion layer | X | X | X |
| Cu adhesion layer | X | no | no |
| Peel Strength (grams/millimeter) | | | |
| Average | 116 | 82 | 90.5 |
| number of Tests | 4 | 6 | 4 |
| Standard Deviation | 9.7 | 9.7 | 5.0 |

These values of the peel strength are considerably above the value of 2.0 grams/millimeter reported for the prior art laminates.

While the invention has been described with respect to certain preferred embodiments and exemplifications, it is not intended to limit the scope of the invention thereby, but solely by the claims appended hereto.

We claim:

1. A method of forming substrate for a metal core microelectronic circuit package, said metal core package comprising a copper core having on at least one side a polymeric dielectric film with a metallic adhesion layer therebetween and having a polymer to metal peel strength of above about 70 grams/millimeter, said method comprising the sequential steps of:
    a. removing copper oxide from the surface of the copper core;
    b. sputter depositing a layer of copper onto the thus treated surface of the copper core;
    c. sputter depositing the metallic adhesion layer onto the sputtered copper layer; and
    d. depositing the polymeric dielectric film atop the metallic adhesion layer.

2. The method of claim 1 wherein the metallic adhesion layer is a chromium layer.

3. The method of claim 2 comprising sputter depositing at least about 300 Angstroms of the chromium adhesion layer onto the copper layer.

4. The method of claim 1 wherein the copper core is a Copper-Invar-Copper laminate.

5. The method of claim 1 comprising sputter depositing the copper layer to a thickness of 1000 Angstroms.

6. The method of claim 1 wherein the polymeric dielectric is polyimide.

7. The method of claim 4 wherein the polyimide is a bis-maleimide—methylene dianiline addition reaction product.

8. The method of claim 1 comprising removing copper oxide by contacting the copper surface with sulfuric acid, rinsing the surface with water, and thereafter contacting the surface with an organic solvent.

9. The method of claim 1 comprising removing copper oxide by heating the copper in the substantial absence of oxygen.

10. The method of claim 1 comprising removing copper oxide by:
    a. contacting the exposed copper surface with sulfuric acid;
    b. rinsing the surface with water;
    c. contacting the surface with an organic solvent; and
    d. heating the copper in the substantial absence of oxygen.

11. A method of fabricating a metal core substrate for a microelectronic circuit package, said package comprising a Copper-Invar-Copper metal core having on at least one side a polyimide dielectric film with a chromium adhesion layer therebetween and having a polymer to metal peel strength of above about 70 grams/millimeter, said method comprising the steps of:
    a. removing copper oxide from the surface of the Copper-Invar-Copper metal core;
    b. sputter depositing a copper film atop the thus treated surface of the Copper-Invar-Copper metal core;
    c. sputter depositing the chromium adhesion layer onto the sputtered copper film; and
    d. depositing the polyimide film atop the chromium adhesion layer.

12. The method of claim 11 comprising sputter depositing the copper film to a thickness of 1000 Angstroms.

13. The method of claim 11 comprising sputter depositing at least about 300 Angstroms of the chromium adhesion layer onto the sputtered copper surface of the Copper-Invar-Copper metal core.

14. The method of claim 11 comprising removing copper oxide by contacting the copper surface of the copper-Invar-copper core with sulfuric acid, rinsing the surface with water, and thereafter contacting the surface with an organic solvent.

15. The method of claim 1 comprising removing copper oxide by heating the copper-Invar-copper metal core in the substantial absence of oxygen.

16. The method of claim 11 comprising removing copper oxide by:
    a. contacting the copper surface of the copper-Invar-copper metal core with sulfuric acid;
    b. rinsing the surface with water;
    c. contacting the surface with an organic solvent; and
    d. heating the copper-Invar-copper in the substantial absence of oxygen.

* * * * *